(12) United States Patent
Michel

(10) Patent No.: US 10,951,222 B2
(45) Date of Patent: Mar. 16, 2021

(54) METHOD AND CIRCUIT FOR CURRENT INTEGRATION

(71) Applicant: ams International AG, Rapperswil (CH)

(72) Inventor: Fridolin Michel, Rapperswil (CH)

(73) Assignee: ams International AG, Rapperswil (CH)

( * ) Notice: Subject to any disclaimer, the term of this patent is extended or adjusted under 35 U.S.C. 154(b) by 0 days.

(21) Appl. No.: 16/629,139

(22) PCT Filed: Jul. 4, 2018

(86) PCT No.: PCT/EP2018/068103
§ 371 (c)(1),
(2) Date: Jan. 7, 2020

(87) PCT Pub. No.: WO2019/011749
PCT Pub. Date: Jan. 17, 2019

(65) Prior Publication Data
US 2020/0295774 A1  Sep. 17, 2020

(30) Foreign Application Priority Data
Jul. 13, 2017 (EP) .................................... 17181215

(51) Int. Cl.
*H03M 3/00* (2006.01)
*H03M 1/12* (2006.01)
(Continued)

(52) U.S. Cl.
CPC ......... *H03M 1/1245* (2013.01); *G11C 27/024* (2013.01); *H03M 1/68* (2013.01); *H03M 1/86* (2013.01)

(58) Field of Classification Search
CPC .......... H03M 3/43; H03M 3/454; H03M 1/12; H03M 3/464; H03M 3/458; H03M 1/1245;
(Continued)

(56) References Cited

U.S. PATENT DOCUMENTS 4,939,516 A * 7/1990 Early .................... H03F 1/304
327/124
6,366,231 B1 * 4/2002 Rao ...................... H03M 1/141
341/156

(Continued)

FOREIGN PATENT DOCUMENTS

EP  1594230  11/2005

OTHER PUBLICATIONS

Chen, C. et al.: "A 11µW 250 Hz BW Two-Step Incremental ADC with 100 dB DR and 91 dB SNDR for Integrated Sensor Interfaces" IEEE, 2004, 978-1-4799-3286-3/14.

(Continued)

*Primary Examiner* — Linh V Nguyen
(74) *Attorney, Agent, or Firm* — MH2 Technology Law Group LLP

(57) ABSTRACT

An input current ($I_{in}$) is transformed into an output integrated voltage ($V_{out\_int}$) using a parallel connection of an operational transconductance amplifier and an integration capacitor. The output integrated voltage is reduced by repeatedly discharging the integration capacitor through a feedback loop via a digital-to-analog converter generating feedback pulses, a feedback clock period ($T_{clk\_DAC}$) defining time intervals between successive rising edges of the feedback pulses. Sampling is performed during an extended feedback clock period (T*) after a lapse of a plurality of feedback clock periods ($T_{clk\_DAC}$).

15 Claims, 6 Drawing Sheets

(51) Int. Cl.
*G11C 27/02* (2006.01)
*H03M 1/68* (2006.01)
*H03M 1/86* (2006.01)

(58) Field of Classification Search
CPC ...... H03M 1/167; H03M 1/462; H03M 1/002;
H03M 3/456; H03M 1/0695; H03M 1/46;
H03M 1/468; H03M 1/747; H03M 3/424;
H03M 3/452; H03M 3/502; H03M 3/50;
H03M 3/30; H03M 1/00; H03M 3/02
USPC .......................................... 341/143, 144, 155
See application file for complete search history.

(56) References Cited

U.S. PATENT DOCUMENTS

| | | | | |
|---|---|---|---|---|
| 6,744,394 B2* | 6/2004 | Liu | ................ | H03M 3/34 |
| | | | | 341/144 |
| 6,750,796 B1* | 6/2004 | Holloway | ............ | H03M 3/494 |
| | | | | 327/337 |
| 6,778,009 B1* | 8/2004 | Lee | ................ | H03F 3/005 |
| | | | | 327/124 |
| 6,869,216 B1* | 3/2005 | Holloway | ............ | G01K 1/028 |
| | | | | 341/143 |
| 7,098,827 B2* | 8/2006 | Motz | ................ | H03M 3/356 |
| | | | | 341/143 |
| 9,197,241 B2* | 11/2015 | Liu | ................ | H03M 3/51 |
| 10,103,744 B1* | 10/2018 | Gutta | ................ | H03M 3/486 |
| 2002/0175844 A1 | 11/2002 | Bach et al. | | |
| 2007/0057830 A1* | 3/2007 | Wiesbauer | ............ | H03L 7/18 |
| | | | | 341/126 |
| 2017/0359077 A1* | 12/2017 | Dempsey | ............ | H03M 1/70 |
| 2018/0241409 A1* | 8/2018 | Dagher | ............ | H03M 3/396 |

OTHER PUBLICATIONS

Chen, C. et al.: "A Micro-Power Two-Step Incremental Analog-to-Digital Converter" IEEE Journal of Solidstaie Circuits, vol. 50, No. 8, Aug. 2015, p. 1796-1808.

De Maeyer, J. et. al.: "A Double-Sampling Extended-Counting ADC" IEEE Journal of Solidstaie Circuits, vol. 39, No. 3, Mar. 2004, p. 411-418.

European Patent Office for International Search Report for PCT/EP2018/068103 dated Sep. 20, 2018.

Kim, J. et al.: "A 14b Extended Counting ADC Implemented in a 24MPixel APS-C CMOS Image Sensor" 2012 IEEE International Solid-State Circuits Conference, p. 390-392.

* cited by examiner

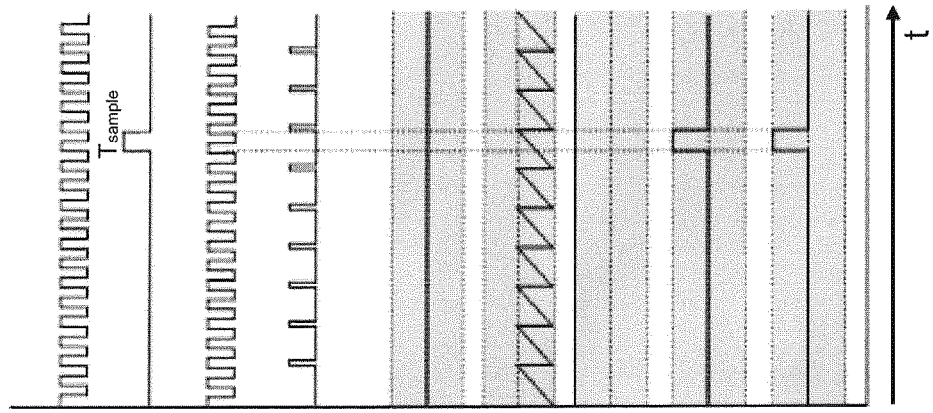
FIG 1a
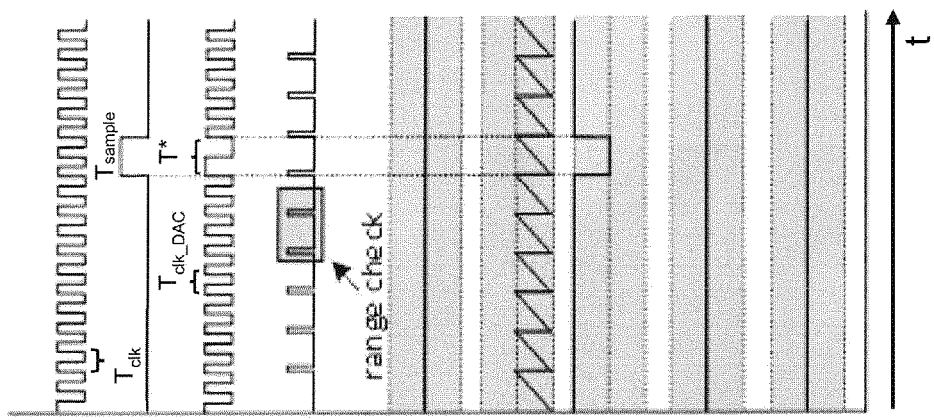
FIG 1b
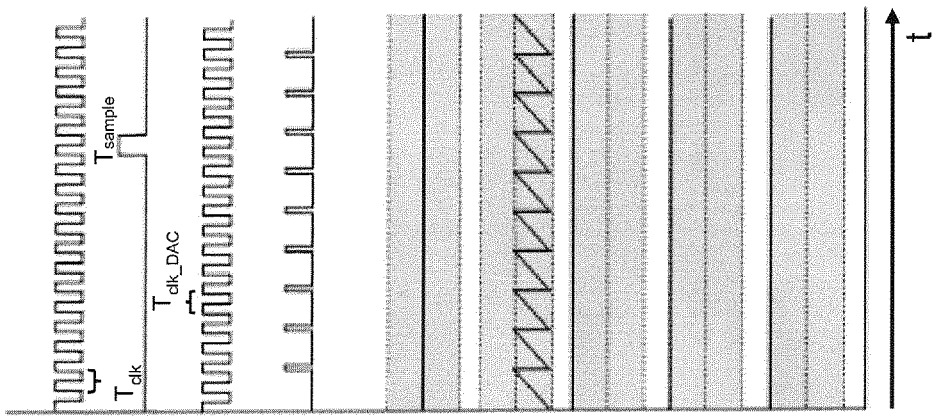
FIG 1c
FIG 1

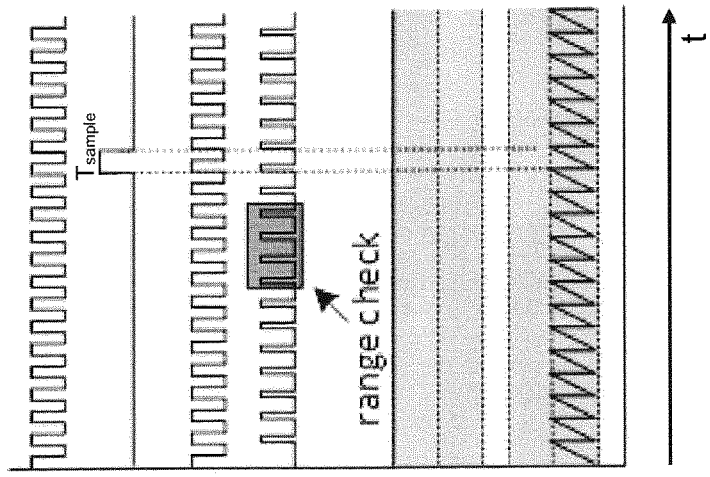
FIG 2b
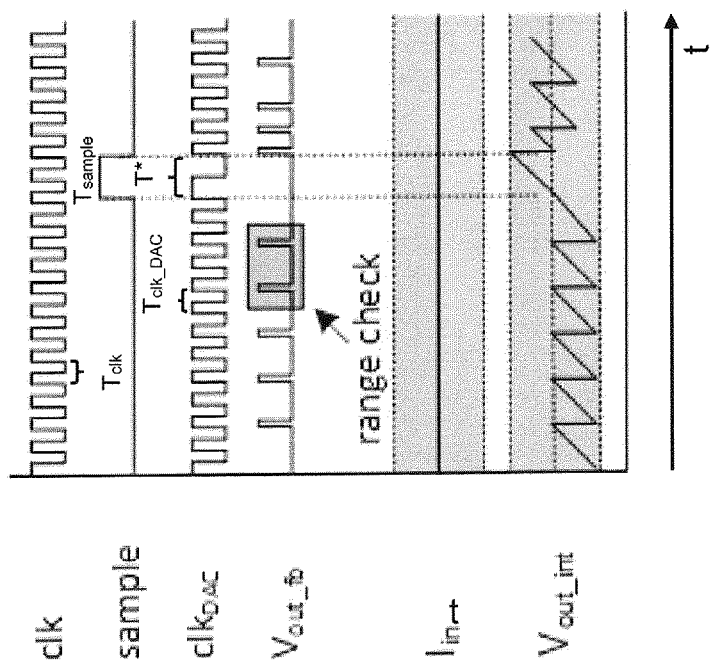
FIG 2a
FIG 2

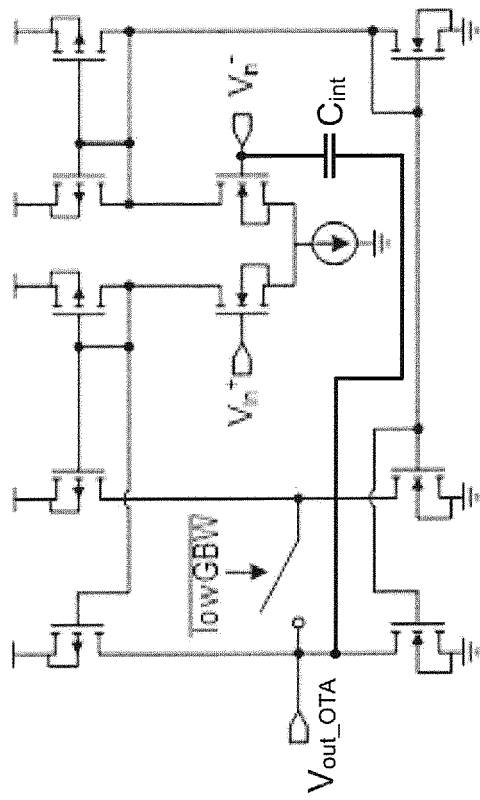
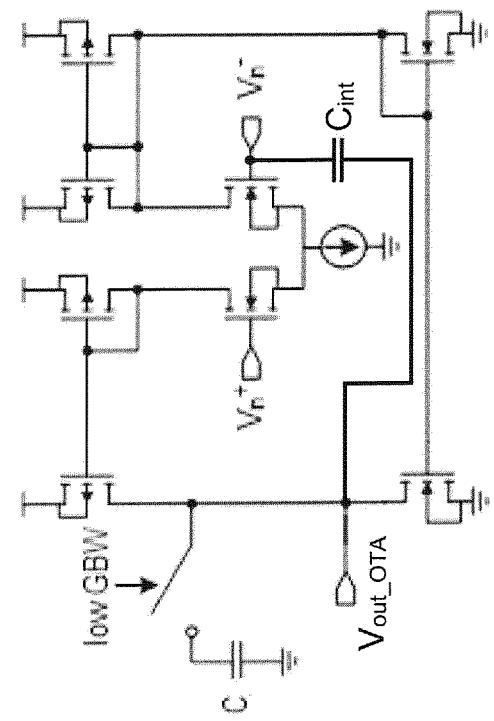
FIG 3a
FIG 3b
FIG 3

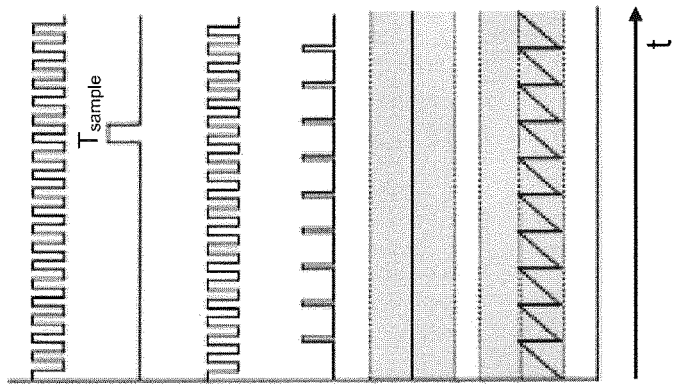
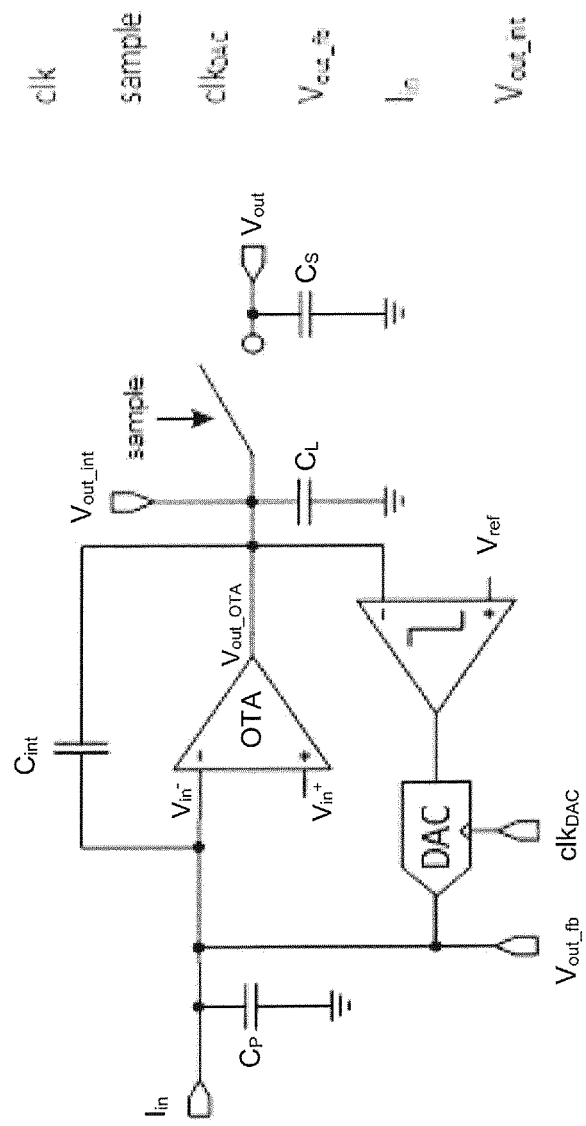
FIG 6a
FIG 6b
FIG 6

METHOD AND CIRCUIT FOR CURRENT INTEGRATION

The present disclosure is related to current integration.

BACKGROUND OF THE INVENTION

An integration circuit is a circuit block often employed in delta-sigma analog-to-digital converters. Delta-sigma modulation converts an analog voltage into a pulse frequency. A particular type of Delta-Sigma converter consists of two conversion stages, where after a coarse voltage conversion, the residual voltage is sampled and converted to a digital signal by the second converter stage.

A general schematic of a current integration configuration is depicted in FIG. 6a. FIG. 6b is a corresponding timing diagram, which shows the temporal variation of the relevant signals and quantities on a time line pointing towards the right. The signal indicated as "clk" is the clock signal providing the minimum time unit employed in the circuit. The signal indicated as "sample" is high only during the sampling time, which in this example equals the clock period. The signal indicated as "$clk_{DAC}$" is derived from "clk" and is the clock signal provided for the feedback DAC to produce a synchronized feedback voltage "$V_{out\_fb}$" based on the previous comparator decision. "$I_{in}$" is the input current, which is assumed to be constant in the example of FIG. 6b. "$V_{out\_int}$" is the output integrated voltage, which is indicated in FIG. 6a.

The input current $I_{in}$ is integrated on the integration capacitor $C_{int}$, thus leading to a growing output integrated voltage $V_{out\_int}$:

$$V_{out\_int} = -\frac{1}{C_{int}} \cdot \int_0^\tau I_{in} \cdot dt$$

The output integrated voltage $V_{out\_int}$ will eventually saturate and is kept in the allowed range by means of a feedback loop. Pulsed feedback is effected by a digital-to-analog converter (DAC), which may be a switched capacitor digital-to-analog converter or a switched current source digital-to-analog converter. The DAC removes charge packages from the integration capacitor $C_{int}$ during the feedback clock period $T_{clk\_DAC}$ when the previous comparator decision was logic zero to keep $|V_{out\_int}| < I_{max} \cdot T_{ckl\_DAC}$ for a maximal input current $I_{max}$. Owing to the pulsed nature of the feedback clock signal $clk_{DAC}$, settling is required within one feedback clock period $T_{clk\_DAC}$. This impacts the output noise and increases the power consumption significantly.

The total output noise $V_{noise\_out,rms}$ is calculated as follows. The input referred noise of the operational transconductance amplifier (OTA) is applied at the positive input in the voltage domain ($V_{in}^+$ in FIG. 6a). Thus it is not integrated, but amplified by the inverse feedback factor $\beta^{-1}=1+(C_p/C_{int})$:

$$V_{noise\_out} = \frac{1}{\beta} \cdot V_{noise\_in} = \left(1 + \frac{C_p}{C_{int}}\right) \cdot V_{noise\_in}$$

In order to obtain the total output noise after sampling, $V_{noise\_out}$ must be integrated over the whole spectrum:

$$V_{noise\_out,rms} = \sqrt{\int_0^\infty \left(\frac{1}{\beta} \cdot V_{noise\_in}(f) \cdot \frac{1}{1+2\pi \cdot f/BW}\right)^2 \cdot df}$$

Assuming constant white noise $V_{in}=k_n/g_m$ with transconductance $g_m$ and noise constant $k_n$, this yields:

$$V_{noise\_out,rms} = \sqrt{\frac{1}{\beta^2} \cdot \frac{k_n}{g_m} \cdot \frac{\pi}{2} \cdot \frac{BW}{2\pi}} = \sqrt{\frac{1}{\beta^2} \cdot \frac{k_n}{g_m} \cdot \frac{BW}{4}}$$

Inserting $$BW = \frac{GBW}{A_{DC}} = \frac{g_m}{C_{eq}} \cdot \beta,$$

where GBW is the gain-bandwidth product and $C_{eq}=C_s+(C_{int}\|C_p)$, yields $$V_{noise\_out,rms} = \sqrt{\frac{k_n}{g_m} \cdot \frac{g_m}{4 \cdot C_{eq}} \cdot \frac{1}{\beta}} = \sqrt{\frac{k_n}{4 \cdot C_{eq}} \cdot \frac{1}{\beta}} \quad (1)$$

Consequently, the output noise is independent of the transconductance $g_m$ and therefore independent of the power consumption. The reason is that a smaller transconductance $g_m$ increases noise, but at the same time reduces the gain-bandwidth product GBW, resulting in higher noise filtering. The calculation so far assumed that the GBW value is not relevant, i. e. the power consumption can be arbitrarily reduced at the cost of settling speed. However, typically there is a settling requirement related to feedback clock period $T_{clk\_DAC}$:

$$\text{settling\_factor} = \frac{T_{clk\_DAC}}{\tau_{ota}} = \frac{T_{clk\_DAC}}{\frac{1}{BW}} = \frac{T_{clk\_DAC}}{C_{eq}} \cdot g_m \cdot \beta \quad (2)$$

Solving equation (2) for $C_{eq}$ and substituting the expression thus obtained in equation (1) yields $$V_{noise\_out,rms} = \sqrt{\frac{k_n}{4 \cdot T_{clk\_DAC} \cdot g_m \cdot \beta^2} \cdot \text{settling\_factor}}$$

The settling time is tied to the DAC clock period due to the pulsed nature of the feedback DAC. Using a non-pulsed continuous feedback current would alleviate the settling constraint. However, this does not provide the inherent analog-to-digital conversion present in the DAC based feedback.

Alternatively, a smoothing filter could be used after the DAC, but this can cause instability in a higher order feedback path. Furthermore, the feedback current does not have a one to one correspondence to the DAC pulses, because it is not known how much of the current comes from the feedback pulses directly before and after output sampling.

SUMMARY OF THE INVENTION

The definitions as described above also apply to the following description unless stated otherwise.

In one embodiment, a method of current integration is applied, which comprises transforming an input current into an output integrated voltage using a parallel connection of an operational transconductance amplifier (OTA) and an integration capacitor, reducing the output integrated voltage by repeatedly discharging the integration capacitor through a feedback loop via a digital-to-analog converter (DAC) generating feedback pulses, a feedback clock period defining time intervals between successive rising edges of the feedback pulses, and sampling during an extended feedback clock period after a lapse of a plurality of feedback clock periods. The extended feedback clock period may especially be twice as long as the feedback clock period.

In a variant of the method, the gain-bandwidth product (GBW) of the operational transconductance amplifier is reduced during sampling.

In a further variant of the method, a range check is performed for the output integrated voltage before sampling. The range check is based on the number of feedback pulses occurring prior to sampling.

In further variants of the method, a switched capacitor digital-to-analog converter or a switched current source digital-to-analog converter is applied.

In a further variant of the method, further feedback pulses are generated between the feedback pulses generated by the digital-to-analog converter. For this purpose a further digital-to-analog converter is applied in the feedback loop.

In a further embodiment, the method of current integration comprises transforming an input current into an output integrated voltage using a parallel connection of an operational transconductance amplifier and an integration capacitor, reducing the output integrated voltage by repeatedly discharging the integration capacitor through a feedback loop via a digital-to-analog converter generating feedback pulses, applying an electric power for the operational transconductance amplifier, and elevating the applied electric power only for sampling during a sampling time.

In a further embodiment, a circuit for current integration is provided, which comprises a parallel connection of an integration capacitor, an operational transconductance amplifier and a feedback loop, the operational transconductance amplifier being configured to transform an input current into an output integrated voltage, a digital-to-analog converter in the feedback loop, the digital-to-analog converter being configured to generate feedback pulses triggering discharges of the integration capacitor, a feedback clock period defining time intervals between successive rising edges of the feedback pulses, and a controller configured to provide an extended feedback clock period after a lapse of a plurality of feedback clock periods.

In an embodiment of the circuit, the controller is configured to perform a range check for the output integrated voltage before sampling, the range check being based on a number of feedback pulses prior to sampling.

In further embodiments of the circuit, the digital-to-analog converter is a switched capacitor digital-to-analog converter or a switched current source digital-to-analog converter.

A further embodiment of the circuit comprises a further digital-to-analog converter in the feedback loop, the controller being configured to enable an alternative operation of the digital-to-analog converter and the further digital-to-analog converter.

In a further embodiment, the circuit comprises a parallel connection of an integration capacitor, an operational transconductance amplifier and a feedback loop, the operational transconductance amplifier being configured to transform an input current into an output integrated voltage, a digital-to-analog converter in the feedback loop, the digital-to-analog converter being configured to generate feedback pulses triggering discharges of the integration capacitor, a supply of electric power for the operational transconductance amplifier, and a controller configured to elevate the applied electric power only during sampling.

The method can be implemented, for example, by one of the corresponding embodiments of the current integration circuit.

BRIEF DESCRIPTION OF THE DRAWINGS

The following is a more detailed description of examples of the method and the circuit in conjunction with the appended figures.

FIG. 1 shows timing diagrams for unmodulated operation, sampling time modulation and power modulation.

FIG. 2 shows timing diagrams for sampling time modulation.

FIG. 3 shows circuit diagrams for GBW reduction of the OTA.

FIG. 6 shows a circuit diagram for a current integrator with feedback and a corresponding timing diagram.

DETAILED DESCRIPTION

Figure 4:
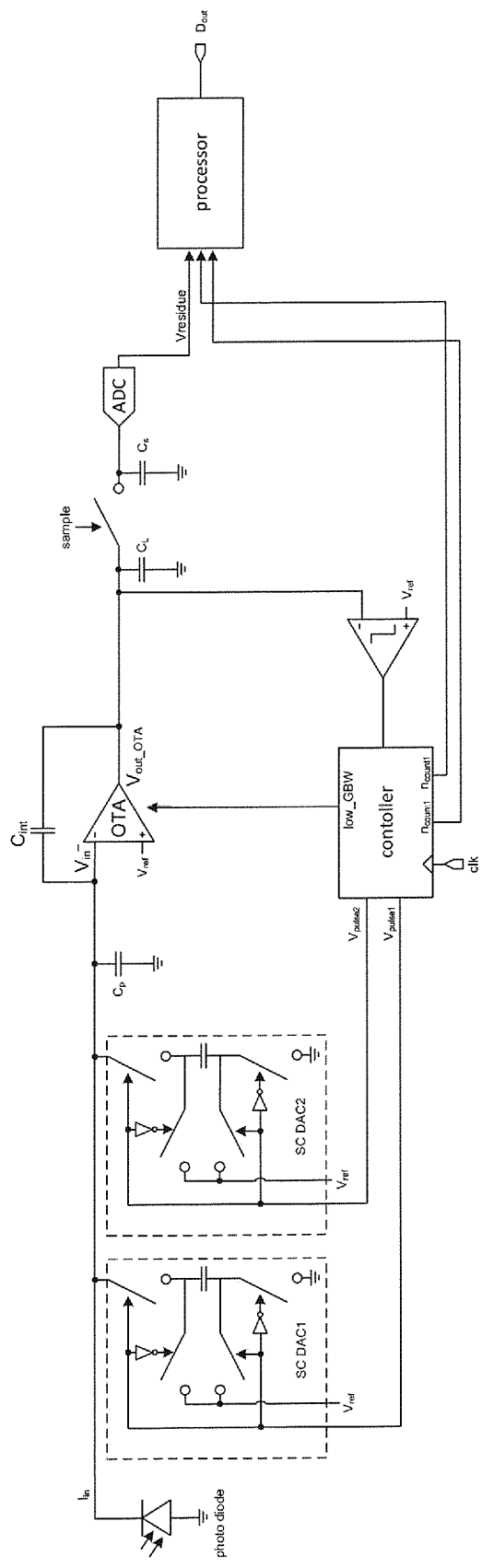
FIG. 4 shows an embodiment of the circuit.

According to one embodiment, doubling the $T_{clk\_DAC}$ takes place during the last cycle, just before sampling, depending on the input current level. As the noise of the OTA is not integrated, only the instantaneous noise during the sampling instant is relevant. The OTA noise power during the rest of the integration time is irrelevant. For input levels below half range of the input current, the frequency of the feedback pulse is smaller than the clock frequency (in the example of FIG. 1b, the frequency of the pulses shown as "$V_{out\_fb}$" is half the frequency of the clock signal "clk").

When the OTA is allowed to settle longer by increasing the feedback clock period $T_{clk\_DAC}$, a smaller transconductance $g_m$ is required and therefore less power for the same output noise. However, the feedback clock period $T_{clk\_DAC}$ is tied to the frequency of feedback pulses needed to keep the output integrated voltage $V_{out\_int}$ in the required voltage range.

Hence, the speed of the OTA can be set high during the major integration time but lower for higher noise filtering during the last cycle right before the sampling instant, if the signal range during that cycle is below half range. The last condition is important, because the last DAC clock cycle has to be doubled, thus allowing only one feedback pulse to occur.

As a result, low noise performance is achieved for the lower signal range where high SNR (signal-to-noise ratio) is most important. For the larger input range, the noise of the DAC is dominant, making the higher OTA noise insignificant. Increasing the DAC period for the last cycle by a factor N increases the available time for settling by N, thus resulting in a factor N power saving for the same output noise (assuming the power is proportional to $g_m$ which is the case for OTA input transistors close to weak inversion).

A timing diagram for a conventional operation is depicted in FIG. 1a, which shows the temporal variation of the relevant signals, quantities and parameters on a time line pointing towards the right. The signal indicated as "clk" is the clock signal providing the clock period $T_{clk}$ as the minimum time unit employed in the circuit. The signal indicated as "sample" is high only during the sampling time, which in this example equals the clock period $T_{clk}$. The signal indicated as "clk$_{DAC}$" is the clock signal provided for the feedback loop and is the same as the signal "clk" during conventional operation. Hence in FIG. 1a the feedback clock period $T_{clk\_DAC}$ is the same as the clock period $T_{clk}$. "$V_{out\_fb}$" is the feedback voltage indicated in FIG. 6a. "$I_{in}$" is the input current, which is assumed to be constant in the example of FIG. 1a. "$V_{out\_it}$" is the output integrated voltage, which is indicated in the circuit diagram of FIG. 6a. "GBW" is the gain-bandwidth product of the OTA, "$g_m$" is the transconductance of the OTA and "P" is the consumed power of the OTA.

A timing diagram for operation by sampling time modulation is depicted in FIG. 1b. Compared with the conventional operation according to FIG. 1a, the feedback clock period $T_{clk\_DAC}$ that corresponds to the sampling time $T_{sample}$ is increased. In the example shown in FIG. 1b, sampling is performed during an extended feedback clock period T*, which is N times as long (in the example of FIG. 1b especially twice as long) as the regular feedback clock period $T_{clk\_DAC}$. Moreover, the GBW is reduced during sampling. Thus the sampling time is increased, especially doubled.

In a prescribed time interval, which is highlighted in FIG. 1b, a range check is performed based on the number of feedback pulses immediately prior to sampling. Important for the feasibility is the assumption that the time constant of the input current is significantly below the sampling time. This constraint does not result in loss of signal information, because the total integration time is a multiple of the feedback clock period $T_{clk\_DAC}$.

In FIG. 2 two different scenarios are exemplified. The worst case scenario in terms of the range of the output integrated voltage $V_{out\_int}$, which is depicted in FIG. 2a, occurs for half range input when the output integrated voltage $V_{out\_int}$ is just below the reference voltage $V_{ref}$ (indicated in FIG. 6a) upon entering the sample period, i. e. feedback is not triggered. This results in the maximal possible value of the output integrated voltage $V_{out\_int}$ at the moment when sampling is required, because the next feedback pulse is delayed by two clock periods $T_{clk}$. However, as shown in FIG. 2a, by limiting the application of the extended feedback clock period T* to input signals below half range, the risk of exceeding the allowed output range can be obviated.

For signals above half range, $T_{clk\_DAC}$ is kept equal to $T_{clk}$ to avoid out of range conditions, according to FIG. 2b, corresponding to a conventional operation according to FIG. 1a. As in this regime DAC noise is typically dominant, the power consumption can still be reduced to one half compared to the power consumption for conventional operation.

A timing diagram for an alternative operation by power modulation is depicted in FIG. 1c. In the method according to FIG. 1c, the feedback clock period $T_{clk\_DAC}$ is kept constant, but the supply power P and the transconductance $g_m$ are increased during sampling in combination with a reduction of the GBW of the OTA. In this way the majority of clock cycles can run at reduced power. However, the increase in supply current in the last cycle can result in supply noise, thus deteriorating accuracy. If a large number of parallel integrators with shifted sampling times is integrated on one chip, the supply current pulsing might smooth out on the main supply line.

The GBW of the OTA during sampling can either be reduced by implementing additional load capacitance, which may be achieved with the circuit according to FIG. 3a, or by attenuating the output current of the OTA during sampling, which may be achieved with the circuit according to FIG. 3b. The GBW can also be reduced by lowering the transconductance $g_m$, but this would not yield any benefit regarding noise.

FIG. 3a is a diagram of a circuit for adding a load capacitor, which can be implemented in the OTA. The inputs and the output of the OTA are indicated by the corresponding voltages $V_{in}^-$, $V_{in}^+$ and $V_{out\_OTA}$. FIG. 3a also shows the connection of the integration capacitor $C_{int}$ between the negative Input ($V_{in}^-$) and the output ($V_{out\_OTA}$) of the OTA.

FIG. 3b is a diagram of a circuit for reducing the output current, which can be implemented in the OTA. The inputs and the output of the OTA are indicated by the corresponding voltages $V_{in}^-$, $V_{in}^+$ and $V_{out\_OTA}$. FIG. 3b also shows the connection of the integration capacitor $C_{int}$ between the negative Input ($V_{in}^-$) and the output ($V_{out\_OTA}$) of the OTA.

FIG. 4 is a circuit diagram for a device wherein the described method can be employed. The device may be a photocurrent readout circuit. The photodiode current is converted to a voltage by a current controlled oscillator. The total number of feedback pulses $n_{count1}+n_{count2}$ during one full integration period $T_{int}$ provides a coarse analog to digital conversion value, which is combined with a fine conversion result by digitization of the output voltage residue $V_{residue}$ of the current integrator. DAC feedback is realized by precharged capacitors that are periodically discharged into the virtual ground node. Two equivalent switched capacitor digital-to-analog converters SC DAC1, SC DAC2 are implemented. The first switched capacitor digital-to-analog converter SC DAC1 is always active by default. The second switched capacitor digital-to-analog converter SC DAC2 is activated in case two consecutive DAC pulses are required. In this way, after triggering the first switched capacitor digital-to-analog converter SC DAC1, at least the time interval of one clock period is provided for precharging before the first switched capacitor digital-to-analog converter SC DAC1 is triggered again. According to this concept, the second switched capacitor digital-to-analog converter SC DAC2 is only activated for input currents above half range. Activation of the second switched capacitor digital-to-analog converter SC DAC2 triggers an "out_of_range" flag that prevents activation of the double sampling time scheme for large input currents.

Figure 5:
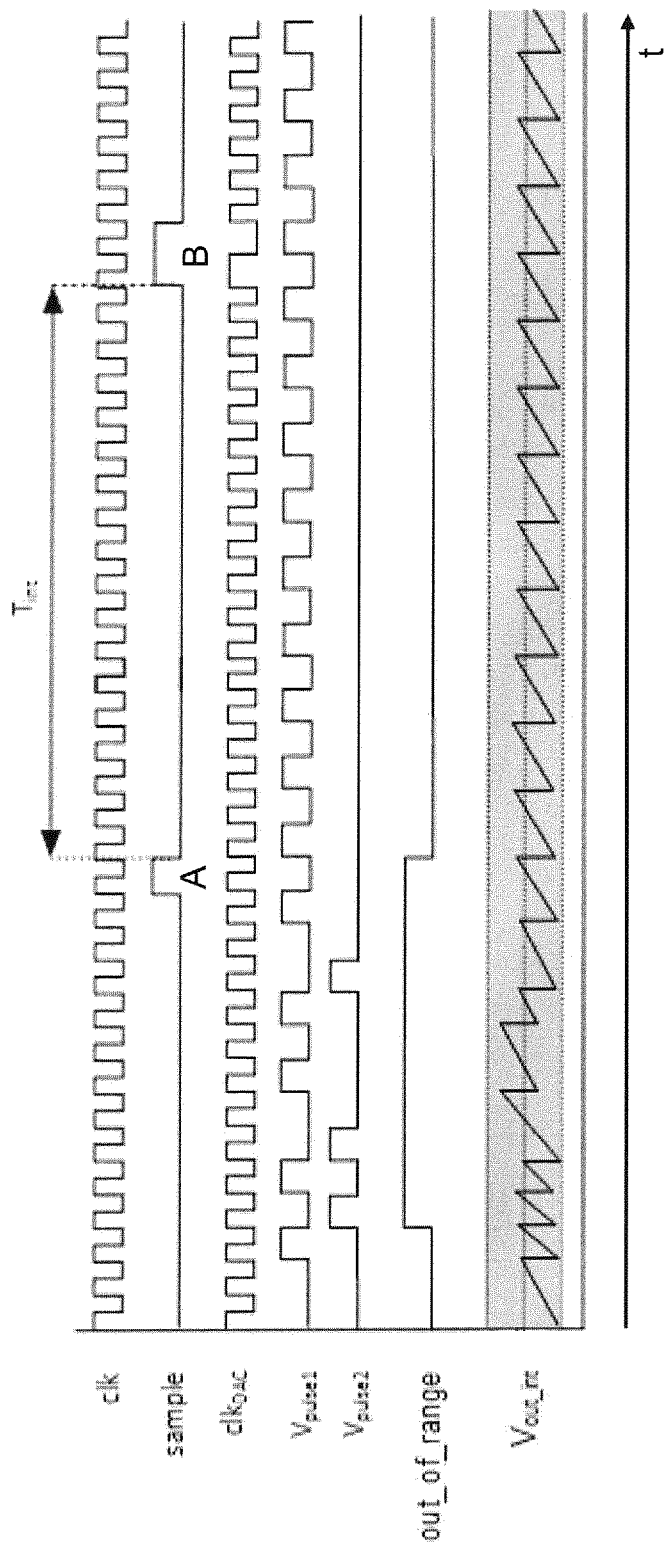
FIG. 5 shows a timing diagram for the embodiment according to FIG. 4.

FIG. 5 is a timing diagram for the operation of a device comprising the circuit according to FIG. 4. "$T_{int}$" is the integration period between two sampling events. "$V_{pulse1}$" and "$V_{pulse2}$" are the pulsed voltages provided by the controller as indicated in FIG. 4. An out-of-range condition is present when the signal "out_of_range" is high. FIG. 5 shows how the second switched capacitor digital-to-analog converter SC DAC2 is used after triggering the first switched capacitor digital-to-analog converter SC DAC1 in out-of-range conditions, when immediately successive feedback pulses are required and there is no time for sufficient recovery of the first switched-capacitor digital-to-analog converter SC DAC1 after triggering. In an out-of-range condition, sampling is only performed for a time interval corresponding to the regular feedback clock period $T_{clk\_OTA}$ (which is indicated at position "A" in FIG. 5), whereas the sampling time is increased when no such condition is met (which is indicated at position "B" in FIG. 5).

This invention enables to reduce the power consumed in an integration stage for output residual sampling by a factor N, in particular by a factor of two.

The invention claimed is:

1. A method of current integration, comprising:
   transforming an input current into an output integrated voltage using a parallel connection of an operational transconductance amplifier and an integration capacitor,
   reducing the output integrated voltage by repeatedly discharging the integration capacitor through a feedback loop via a digital-to-analog converter generating feedback pulses, a feedback clock period defining time intervals between successive rising edges of the feedback pulses, and
   sampling during an extended feedback clock period after a lapse of a plurality of feedback clock periods.

2. The method of claim 1, wherein the extended feedback clock period is N times as long as the feedback clock period.

3. The method of claim 1, further comprising:
   reducing a gain-bandwidth product of the operational transconductance amplifier during sampling.

4. The method of claim 1, further comprising:
   performing a range check for the output integrated voltage before sampling, the range check being based on a number of feedback pulses prior to sampling.

5. The method of claim 1, wherein the digital-to-analog converter is a switched capacitor digital-to-analog converter.

6. The method of claim 1, wherein the digital-to-analog converter is a switched current source digital-to-analog converter.

7. The method of claim 1, further comprising:
   generating further feedback pulses between the feedback pulses generated by the digital-to-analog converter by applying a further digital-to-analog converter in the feedback loop.

8. A method of current integration, comprising:
   transforming an input current into an output integrated voltage using a parallel connection of an operational transconductance amplifier and an integration capacitor,
   reducing the output integrated voltage by repeatedly discharging the integration capacitor through a feedback loop via a digital-to-analog converter generating feedback pulses,
   applying an electric power for the operational transconductance amplifier, and
   elevating the applied electric power only for sampling during a sampling time.

9. A circuit for current integration, comprising:
   a parallel connection of an integration capacitor, an operational transconductance amplifier and a feedback loop, the operational transconductance amplifier being configured to transform an input current into an output integrated voltage,
   a digital-to-analog converter in the feedback loop, the digital-to-analog converter being configured to generate feedback pulses triggering discharges of the integration capacitor, a feedback clock period defining time intervals between successive rising edges of the feedback pulses, and
   a controller configured to provide an extended feedback clock period after a lapse of a plurality of feedback clock periods.

10. The circuit of claim 9, wherein:
    the controller is configured to perform a range check for the output integrated voltage before sampling, the range check being based on a number of feedback pulses prior to sampling.

11. The circuit of claim 9, wherein the digital-to-analog converter is a switched capacitor digital-to-analog converter.

12. The circuit of claim 9, wherein the digital-to-analog converter is a switched current source digital-to-analog converter.

13. The circuit of claim 9, further comprising:
    a further digital-to-analog converter in the feedback loop, the controller being configured to enable an alternative operation of the digital-to-analog converter and the further digital-to-analog converter.

14. The method of claim 1, wherein the extended feedback clock period is provided when an input level of the input current is less than half of a signal range of the input current.

15. The circuit of claim 9, wherein the controller configured to provide the extended feedback clock period when an input level of the input current is less than half of a signal range of the input current.

* * * * *